United States Patent
Hosoi et al.

(10) Patent No.: US 11,950,376 B2
(45) Date of Patent: Apr. 2, 2024

(54) COPPER-CLAD LAMINATE

(71) Applicant: MITSUI MINING & SMELTING CO., LTD., Tokyo (JP)

(72) Inventors: Toshihiro Hosoi, Ageo (JP); Toshifumi Matsushima, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 17/042,484

(22) PCT Filed: Mar. 7, 2019

(86) PCT No.: PCT/JP2019/009093
§ 371 (c)(1),
(2) Date: Sep. 28, 2020

(87) PCT Pub. No.: WO2019/188087
PCT Pub. Date: Oct. 3, 2019

(65) Prior Publication Data
US 2021/0029823 A1    Jan. 28, 2021

(30) Foreign Application Priority Data
Mar. 30, 2018    (JP) .................. 2018-067027

(51) Int. Cl.
*B32B 7/12* (2006.01)
*B32B 5/02* (2006.01)
(Continued)

(52) U.S. Cl.
CPC .............. *H05K 3/386* (2013.01); *B32B 5/02* (2013.01); *B32B 7/12* (2013.01); *B32B 15/08* (2013.01);
(Continued)

(58) Field of Classification Search
CPC ........ H05K 3/022; B32B 15/20; B32B 15/14; B32B 7/12; B32B 2255/06; B32B 2255/26; B32B 15/08; B32B 15/09
See application file for complete search history.

(56) References Cited

U.S. PATENT DOCUMENTS

| 4,612,252 A * | 9/1986 | Sagane | ................. B32B 27/32 |
| | | | 428/313.5 |
| 2012/0006588 A1* | 1/2012 | Kakiuchi | ............. C08G 59/686 |
| | | | 174/258 |

(Continued)

FOREIGN PATENT DOCUMENTS

| CN | 107009697 A | 8/2017 |
| CN | 206840863 | 1/2018 |

(Continued)

OTHER PUBLICATIONS

Machine translation of JP6610375B2 for JP2017-171833A published Sep. 2017. (Year: 2017).*

(Continued)

*Primary Examiner* — Monique R Jackson
(74) *Attorney, Agent, or Firm* — GREENBLUM & BERNSTEIN, P.L.C.

(57) ABSTRACT

There is provided a copper-clad laminate in which transmission characteristics exhibited by a resin layer can be further improved while sufficient peel strength between a copper foil and the resin layer is ensured. The laminate includes a copper foil; an adhesive layer including a polyphenylene ether resin, a polyimide resin, an olefin-based resin, a liquid crystal polymer, a polyester resin, a polystyrene resin, a hydrocarbon elastomer, a benzoxazine resin, an active ester resin, a cyanate ester resin, a bismaleimide resin, a butadiene resin, a hydrogenated or non-hydrogenated styrene butadiene resin, an epoxy resin, a fluororesin, a vinyl-group-containing resin, or the like; and a resin layer.

(Continued)

The maximum height Sz at a copper foil surface on the adhesive layer side is 6.8 μm or less. The dielectric loss tangent value of the adhesive layer at 1 GHz, $\delta a$, is equal to or less than that of the resin layer, $\delta r$.

9 Claims, 2 Drawing Sheets

(51) Int. Cl.
*B32B 15/08* (2006.01)
*B32B 15/14* (2006.01)
*B32B 15/20* (2006.01)
*H05K 1/03* (2006.01)
*H05K 1/09* (2006.01)
*H05K 3/02* (2006.01)
*H05K 3/38* (2006.01)

(52) U.S. Cl.
CPC .............. *B32B 15/14* (2013.01); *B32B 15/20* (2013.01); *H05K 1/0366* (2013.01); *H05K 1/09* (2013.01); *H05K 3/022* (2013.01); *B32B 2255/06* (2013.01); *B32B 2255/10* (2013.01); *B32B 2255/26* (2013.01); *B32B 2260/021* (2013.01); *B32B 2260/046* (2013.01); *B32B 2262/101* (2013.01); *B32B 2307/204* (2013.01); *B32B 2307/538* (2013.01); *B32B 2457/08* (2013.01)

(56) References Cited

U.S. PATENT DOCUMENTS

| | | | | |
|---|---|---|---|---|
| 2014/0044918 A1* | 2/2014 | Zeng | ..................... | C08L 71/126 524/508 |
| 2014/0110153 A1* | 4/2014 | Kashiwagi | ........... | H05K 3/4069 174/251 |
| 2016/0021740 A1* | 1/2016 | Li | ........................ | C08K 5/5397 428/458 |
| 2017/0209406 A1* | 7/2017 | Kunimoto | .............. | A61K 47/32 |
| 2017/0260364 A1* | 9/2017 | Hsieh | ....................... | C08J 5/249 |
| 2018/0170007 A1* | 6/2018 | Chiba | .................. | B32B 15/082 |
| 2018/0288884 A1* | 10/2018 | Ori | ......................... | B32B 15/18 |
| 2021/0040360 A1* | 2/2021 | Yamamoto | ............. | H05K 3/386 |

FOREIGN PATENT DOCUMENTS

| | | | | |
|---|---|---|---|---|
| JP | 2003-309336 A | 10/2003 | | |
| JP | 2009-518208 A | 5/2009 | | |
| JP | 2009-302606 A | 12/2009 | | |
| JP | 5118469 B2 | 1/2013 | | |
| JP | 2017-086591 | 5/2014 | | |
| JP | 2016-028885 A | 3/2016 | | |
| JP | 2016-225513 A | 12/2016 | | |
| JP | 2017-121807 A | 7/2017 | | |
| JP | 2017-171833 A | 9/2017 | | |
| JP | 2017-172049 | 9/2017 | | |
| KR | 10-2017-0002705 | 1/2017 | | |
| TW | 201533280 A | 9/2015 | | |
| TW | 201617426 A | 5/2016 | | |
| TW | 201736118 A | 10/2017 | | |
| WO | 2013/105650 A1 | 7/2013 | | |
| WO | WO-2014148155 A1 * | 9/2014 | ............. | B32B 27/08 |
| WO | WO-2017002567 A1 * | 1/2017 | ................ | C08F 2/44 |
| WO | WO-2017018232 A1 * | 2/2017 | ............... | H05K 1/09 |

OTHER PUBLICATIONS

Machine translation of JP2016-225513A published Dec. 2016. (Year: 2016).*
Machine translation of JP WO2014148155 A1, published Sep. 25, 2014, powered by EPO and Google. (Year: 2014).*
ISR issued in WIPO Patent Application No. PCT/JP2019/009093, dated Jun. 4, 2019, English translation.
IPRP/Written Opinion issued in WIPO Patent Application No. PCT/JP2019/009093, dated Oct. 6, 2020, English translation.
TW Office Action issued in TW Patent Application No. 108108817, dated Nov. 19, 2019, English translation.
TW Office Action issued in TW Patent Application No. 108108817, dated Jun. 23, 2020, English translation.
Office Action issued in CN Patent Application No. 201980018191.5, dated Jul. 12, 2022, English translation.
Yang et al., "Theoretical Computation and Experimental Research of Mechanical Bonding Face Basic Characteristic Parameters", Southwestern Traffic Univ. Press, Mar. 2016, pp. 19-20 (discussed in English translation of CN OA).
Xim, "New Technology applications and New Product Development and Standard Utility and Material Analytical Testing of New Engineering Materials Production", Meter Iter, Nov. 2004, pp. 81-82 (discussed in English translation of CN OA).
Short, "Electronic Basic Tratudes", Beijing Mailpower Univ. Press, Apr. 2011, pp. 126-127 (discussed in English translation of CN OA).

* cited by examiner

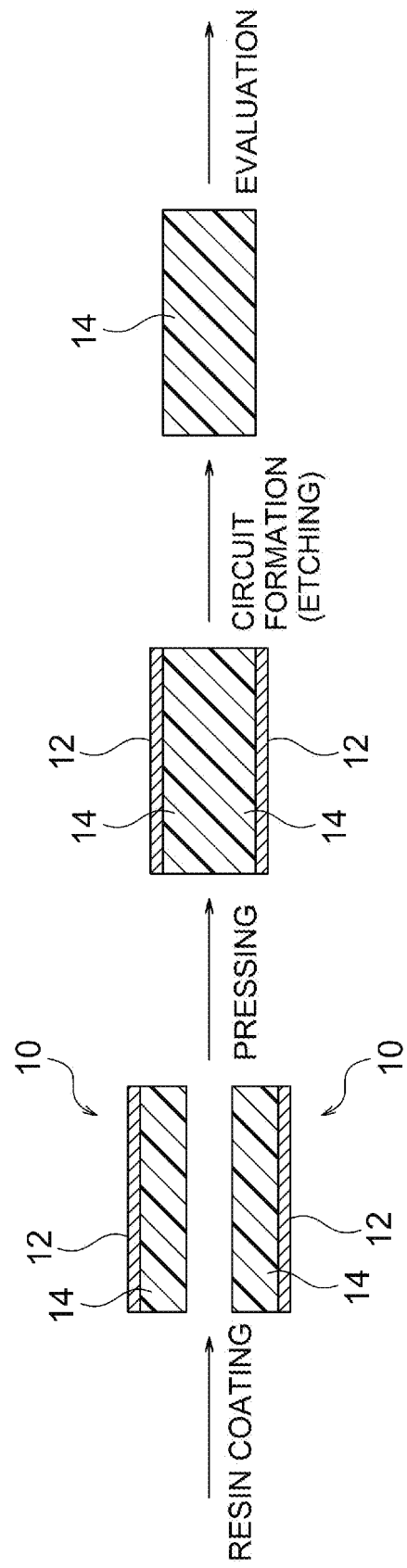

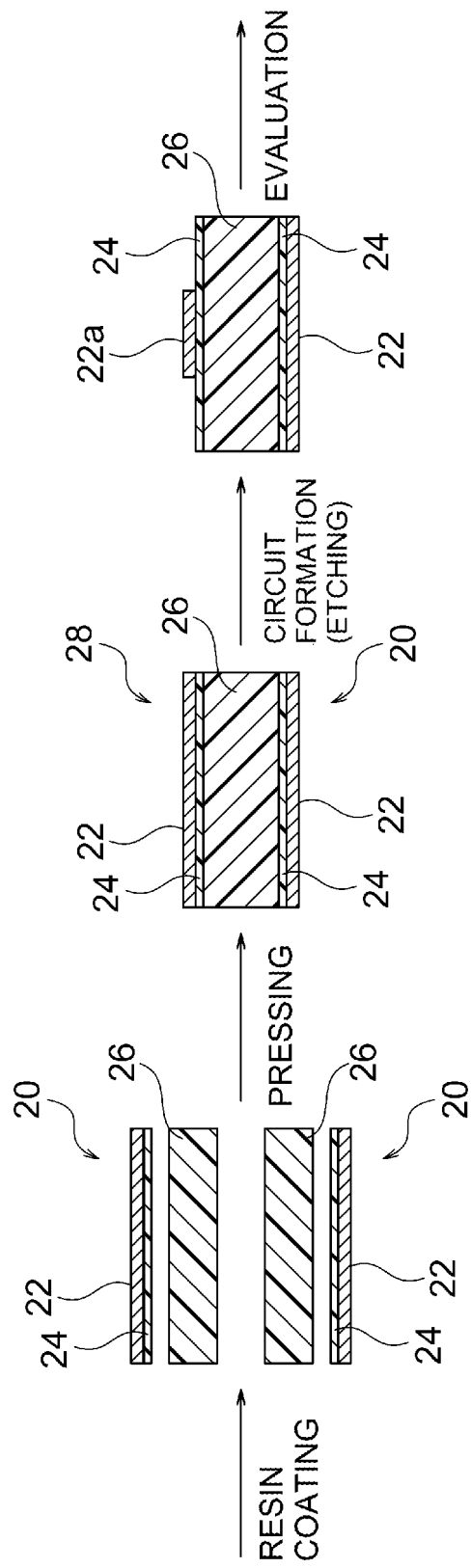

COPPER-CLAD LAMINATE

TECHNICAL FIELD

The present invention relates to a copper-clad laminate.

BACKGROUND ART

Printed wiring boards are widely used in electronic equipment such as portable electronic equipment. Particularly, with higher functionality of portable electronic equipment and the like in recent years, the frequencies of signals have become higher, and printed wiring boards suitable for such high frequency applications have been required. For these high frequency printed wiring boards, those having low transmission loss are desired in order to allow transmission without deteriorating the quality of high frequency signals. A printed wiring board comprises a copper foil processed into a wiring pattern and an insulating resin substrate, and the transmission loss is mainly composed of the conductor loss due to the copper foil and the dielectric loss due to the insulating resin substrate. Therefore, in a resin layer-attached copper foil applied to high frequency applications, the dielectric loss due to the resin layer is desirably suppressed. For this, excellent dielectric characteristics, particularly a low dielectric loss tangent, are required of the resin layer.

As a copper foil used for the manufacture of a copper-clad laminate or a printed wiring board, a resin-attached copper foil comprising a resin layer on one surface in order to enhance adhesion to a resin substrate such as a prepreg is known. A prepreg is a generic name for a composite material in which a substrate such as a synthetic resin plate, a glass plate, a glass woven fabric, a glass nonwoven fabric, or paper is impregnated with a synthetic resin. For example, Patent Literature 1 (JP5118469B) discloses a resin layer-attached copper foil comprising a filler particle-containing resin layer on a surface of a copper foil, and it is disclosed that the filler particle-containing resin layer is a semi-cured resin layer comprising an aromatic polyamide resin polymer, an epoxy resin, and a curing accelerator and comprising filler particles treated with phenylaminosilane, which is an amino silane coupling agent.

Patent Literature 2 (JP2009-518208A) discloses a method for manufacturing a high frequency printed circuit board laminate, and this manufacturing method allegedly comprises providing a low profile copper foil sheet, applying a low dielectric loss resin layer, partially curing the low dielectric loss resin to form a low profile copper sheet coated with the resin, and laminating the low profile copper sheet coated with the resin on a prepreg to form a copper-clad laminate. Patent Literature 3 (JP2016-028885A) discloses a metal-clad laminate with which a printed wiring board having reduced loss during signal transmission can be manufactured, and describes a metal-clad laminate comprising an insulating layer comprising a polyphenylene ether compound, a metal layer attached to the insulating layer, and an intermediate layer comprising a silane compound interposed between the insulating layer and the metal layer, wherein the ten-point average roughness Rz of the attachment surface of the metal layer is 0.5 μm or more and 4 μm or less.

CITATION LIST

Patent Literature

Patent Literature 1: JP5118469B
Patent Literature 2: JP2009-518208A
Patent Literature 3: JP2016-028885A

SUMMARY OF INVENTION

It has been considered that in a copper-clad laminate or a printed wiring board, a resin substrate such as a prepreg occupies a large portion in the thickness direction, and therefore the dielectric loss tangent of an superthin adhesive layer (also referred to as a primer layer) interposed between the resin substrate and a copper foil and the transmission loss due to the dielectric loss tangent are at negligible levels. Therefore, in the present circumstances, attempts to reduce a dielectric loss tangent and transmission loss in a copper-clad laminate have been directed exclusively to the improvement of the copper foil and the resin substrate. In other words, it has been considered that even if the dielectric loss tangent of the adhesive layer is somewhat large, it is offset by the dielectric characteristics of the resin substrate because of the thinness of the adhesive layer and, as a result, hardly influences the entire dielectric characteristics. However, it has become clear that when evaluation is performed in a much higher frequency band (for example, such as 50 GHz) rather than at the previous 10 GHz level, with the need for even higher frequencies in recent years, the dielectric loss tangent of even the superthin adhesive layer (primer layer) and the transmission loss due to the dielectric loss tangent are unexpectedly largely reflected in the dielectric characteristics of the copper-clad laminate or the printed wiring board. On the other hand, in terms of the function as the adhesive layer, high adhesion (peel strength) to the copper foil is desired.

The present inventors have now found that when in a copper-clad laminate comprising a copper foil, an adhesive layer, and a resin layer in order, a specific resin is selected as the adhesive layer and the surface roughness of the copper foil on the adhesive layer side is specified, it is possible to provide a copper-clad laminate in which transmission characteristics exhibited by a resin layer can be further improved while sufficient peel strength between a copper foil and the resin layer is ensured.

Therefore, it is an object of the present invention to provide a copper-clad laminate in which transmission characteristics exhibited by a resin layer can be further improved while sufficient peel strength between a copper foil and the resin layer is ensured.

According to an aspect of the present invention, there is provided a copper-clad laminate comprising:

a copper foil;

an adhesive layer provided on a surface of the copper foil and comprising one or more selected from the group consisting of a polyphenylene ether resin, a polyimide resin, an olefin-based resin, a liquid crystal polymer, a polyester resin, a polystyrene resin, a hydrocarbon elastomer, a benzoxazine resin, an active ester resin, a cyanate ester resin, a bismaleimide resin, a butadiene resin, a hydrogenated or non-hydrogenated styrene butadiene resin, an epoxy resin, a fluororesin, a resin having a vinyl group, and copolymers thereof; and a resin layer provided on a surface of the adhesive layer, wherein the surface of the copper foil on the adhesive layer side has a maximum height Sz of 6.8 μm or less as measured in accordance with ISO 25178, and the adhesive layer has a dielectric loss tangent value at a frequency of 1 GHz, $\delta a$, which is equal to or less than a dielectric loss tangent value of the resin layer at a frequency of 1 GHz, $\delta r$.

According to another aspect of the present invention, there is provided a method for manufacturing the copper-clad laminate, comprising the steps of:

providing a copper foil having a surface having a maximum height Sz of 6.8 μm or less as measured in accordance with ISO 25178;

applying a resin varnish comprising an adhesive to a surface of the copper foil and drying the resin varnish to obtain an adhesive-attached copper foil, the adhesive comprising one or more selected from the group consisting of a polyphenylene ether resin, a polyimide resin, an olefin-based resin, a liquid crystal polymer, a polyester resin, a polystyrene resin, a hydrocarbon elastomer, a benzoxazine resin, an active ester resin, a cyanate ester resin, a bismaleimide resin, a butadiene resin, a hydrogenated or non-hydrogenated styrene butadiene resin, an epoxy resin, a fluororesin, a resin having a vinyl group, and copolymers thereof, and, having a dielectric loss tangent value at a frequency of 1 GHz of δa after curing; and bonding the adhesive-attached copper foil to a resin layer having a dielectric loss tangent value at a frequency of 1 GHz of δr to form a copper-clad laminate, wherein the δa is equal to or less than the δr.

BRIEF DESCRIPTION OF DRAWINGS

FIG. 1 is a diagram showing the procedure for fabricating an adhesive layer sample for dielectric characteristic evaluation in Examples 1 to 10.

FIG. 2 is a diagram showing the procedure for fabricating a copper-clad laminate sample in Examples 1 to 10.

DESCRIPTION OF EMBODIMENTS

Embodiments of the present invention will be described below.

Definitions

The definitions of parameters used for specifying the present invention are shown below.

As used herein, "maximum height Sz" is a parameter that represents the distance from the highest point to the lowest point of a surface measured in accordance with ISO 25178. The maximum height Sz can be calculated by measuring the surface profile of a predetermined measurement area (for example, a region of 10000 μm$^2$) at a copper foil surface by a commercially available laser microscope.

In the present invention, "kurtosis Sku" is a parameter that represents the sharpness of height distribution measured in accordance with ISO 25178, and is also referred to as peakedness. Sku=3 means that the height distribution is a normal distribution. Sku>3 means that there are many sharp peaks and valleys at a surface. Sku<3 means that the surface is flat. The kurtosis Sku can be calculated by measuring the surface profile of a predetermined measurement area (for example, a region of 10000 μm$^2$) at a copper foil surface by a commercially available laser microscope.

As used herein, a "dielectric loss tangent value at a frequency of 1 GHz" is a dielectric loss tangent value measured by the SPDR dielectric resonator method in accordance with ASTMD2520 (JIS C2565: 1992). This dielectric loss tangent value can be measured using a commercially available network analyzer.

Copper-Clad Laminate

The copper-clad laminate of the present invention comprises a copper foil, an adhesive layer, and a resin layer. The adhesive layer comprises one or more selected from the group consisting of a polyphenylene ether resin, a polyimide resin, an olefin-based resin, a liquid crystal polymer, a polyester resin, a polystyrene resin, a hydrocarbon elastomer, a benzoxazine resin, an active ester resin, a cyanate ester resin, a bismaleimide resin, a butadiene resin, a hydrogenated or non-hydrogenated styrene butadiene resin, an epoxy resin, a fluororesin, a resin having a vinyl group, and copolymers thereof and is provided on a surface of the copper foil. The resin layer is provided on the surface of the adhesive layer. In the copper-clad laminate, the maximum height Sz at the surface of the copper foil on the adhesive layer side is 6.8 μm or less. The dielectric loss tangent value of the adhesive layer at a frequency of 1 GHz, δa, is equal to or less than the dielectric loss tangent value of the resin layer at a frequency of 1 GHz, δr. When in this manner, in a copper-clad laminate comprising a copper foil, an adhesive layer, and a resin layer in order, a specific resin is selected as the adhesive layer and the surface roughness of the copper foil on the adhesive layer side is specified, it is possible to provide a copper-clad laminate in which transmission characteristics exhibited by a resin layer can be further improved while sufficient peel strength between a copper foil and the resin layer is ensured. Therefore, the copper-clad laminate of the present invention can be preferably applied to applications used in a high frequency band, for example, with signal frequencies of 10 GHz or more, such as high frequency boards used in automobile antennae, cellular phone base station antennae, high performance servers, anti-collision radars, or the like, or printed wiring boards for high frequency digital communication in network equipment. Examples of such network equipment include (i) base station servers, routers, and the like, (ii) office networks, and (iii) the basic systems of high speed portable communication.

As described above, it has been considered that in a copper-clad laminate or a printed wiring board, a resin substrate such as a prepreg occupies a large portion in the thickness direction, and therefore the dielectric loss tangent of an superthin adhesive layer (also referred to as a primer layer) interposed between the resin substrate and a copper foil, and the transmission loss due to the dielectric loss tangent are at negligible levels. However, it has become clear that when evaluation is performed in a much higher frequency band (for example, such as 50 GHz) rather than at the previous 10 GHz level, with the need for even higher frequencies in recent years, the dielectric loss tangent of even the superthin adhesive layer (primer layer) and the transmission loss due to the dielectric loss tangent are unexpectedly largely reflected in the dielectric characteristics of the copper-clad laminate or the printed wiring board. In this respect, in the copper-clad laminate of the present invention, by selectively using, as the adhesive layer, the above-described one, more improved transmission characteristics (more reduced transmission loss) than those of a laminate consisting of a copper foil and a resin layer (adhesive layer-free laminate) can be achieved. Moreover, as the adhesive layer, high adhesion (peel strength) between the copper foil and the resin layer can also be achieved.

Specifically, in a state in which the adhesive layer is cured, the peel strength of the copper foil from the adhesive layer measured in accordance with JIS C 6481-1996 is preferably 0.3 kN/m or more, more preferably 0.4 kN/m or more, further preferably 0.5 kN/m or more, and most preferably 0.6 kN/m or more. Higher peel strength is generally preferable, but the product typically has a value of 1.4 kN/m or less, more typically 1.2 kN/m or less.

The copper foil may be a metal foil as electrodeposited or rolled (so-called raw foil) or may be in the form of a surface-treated foil in which at least either one surface has been subjected to surface treatment, as long as the surface on the adhesive layer side satisfies the above-described maximum height Sz. The surface treatment can be various types of surface treatments performed for enhancing or providing some properties (for example, rustproofing properties, humidity resistance, chemical resistance, acid resistance, heat resistance, and adhesion to a substrate) on the surface of the metal foil. The surface treatment may be performed on at least one surface of the metal foil or on both surfaces of the metal foil. Examples of the surface treatment performed on the copper foil include rustproofing treatment, silane treatment, roughening treatment, and barrier forming treatment.

The maximum height Sz at the surface of the copper foil on the adhesive layer side is 6.8 µm or less, preferably 0.15 µm or more and 6.8 µm or less, more preferably 0.25 µm or more and 5.0 µm or less, and further preferably 0.30 µm or more and 3.0 µm or less. When the maximum height Sz is within such ranges, the transmission loss can be desirably reduced while sufficient adhesion to the resin layer via the adhesive layer is ensured. In other words, the conductor loss due to the copper foil, which can increase due to the skin effect of the copper foil, can be reduced to achieve a further reduction in transmission loss.

The kurtosis (peakedness) Sku at the surface of the copper foil on the adhesive layer side is preferably 2.0 or more and 4.0 or less, more preferably 2.2 or more and 3.8 or less, and further preferably 2.4 or more and 3.5 or less. When the kurtosis (peakedness) Sku is within such ranges, the transmission loss can be desirably reduced. In other words, the conductor loss due to the copper foil, which can increase due to the skin effect of the copper foil, can be reduced to achieve a further reduction in transmission loss.

The thickness of the copper foil is not particularly limited, but is preferably 0.1 µm or more and 100 µm or less, more preferably 0.15 µm or more and 50 µm or less, and further preferably 0.2 µm or more and 40 µm or less. When the thickness is within these ranges, processes such as a modified semi-additive process (MSAP), a semi-additive process (SAP), and a subtractive process, which are general pattern forming methods for the formation of the wiring of printed wiring boards, can be adopted. For the copper foil, a carrier-attached copper foil may be used.

The adhesive layer is a layer that functions as a primer layer for enhancing the adhesion between the copper foil and the resin layer (for example, an insulating substrate), and comprises one or more selected from the group consisting of a polyphenylene ether resin, a polyimide resin (typically a low dielectric polyimide resin), an olefin-based resin (for example, a polyethylene resin, a polypropylene resin, a polymethylpentene resin, or a cycloolefin resin), a liquid crystal polymer, a polyester resin, a polystyrene resin, a hydrocarbon elastomer, a benzoxazine resin, an active ester resin, a cyanate ester resin, a bismaleimide resin, a butadiene resin, a hydrogenated or non-hydrogenated styrene butadiene resin, an epoxy resin (for example, a dicyclopentadiene type epoxy resin), a fluororesin, a resin having a vinyl group, and copolymers thereof. All of these resins not only exert excellent adhesion performance to the resin layer and the copper foil but have a low dielectric loss tangent and therefore contribute to a reduction in transmission loss.

Specifically, the dielectric loss tangent value of the adhesive layer at a frequency of 1 GHz, $\delta a$, is equal to or less than the dielectric loss tangent value of the resin layer at a frequency of 1 GHz, $\delta r$, preferably less than $\delta r$. For example, the dielectric loss tangent value of the adhesive layer at a frequency of 1 GHz, $\delta a$, is preferably 0.0001 or more and 0.003 or less, more preferably 0.0005 or more and 0.003 or less, further preferably 0.0008 or more and 0.0025 or less, and particularly preferably 0.001 or more and 0.002 or less. When the dielectric loss tangent value $\delta a$ is within these ranges, the dielectric loss tangent value of the adhesive layer, $\delta a$, is equal to or less than the dielectric loss tangent value of the resin layer, $\delta r$, when the dielectric loss tangent value of the resin layer, $\delta r$, is 0.003 or more. In any case, by adopting an adhesive layer having a low dielectric loss tangent value $\delta a$ as described above, the transmission characteristics exhibited by the resin layer can be unexpectedly improved.

According to a preferred aspect of the present invention, the adhesive layer comprises at least one selected from the group consisting of an olefin-based resin, a polystyrene resin, a liquid crystal polymer, and a fluororesin in an amount of 10% by weight or more, more preferably 15% by weight or more, and further preferably 20% by weight or more based on the total weight of the adhesive layer. When the adhesive layer comprises the above resin in such ranges, advantages are that in addition to being able to exert the above-described effects much more effectively, the dielectric loss tangent can be made lower.

According to another preferred aspect of the present invention, the adhesive layer comprises a polyphenylene ether resin in an amount of preferably 20% by weight or more, more preferably 25% by weight or more, and further preferably 30% by weight or more based on the total weight of the adhesive layer. When the adhesive layer comprises the above resin in such ranges, advantages are that in addition to being able to exert the above-described effects much more effectively, the heat resistance and the chemical resistance are enhanced.

According to yet another preferred aspect of the present invention, the adhesive layer comprises a polyimide resin in an amount of preferably 10% by weight or more, more preferably 20% by weight or more, and further preferably 30% by weight or more based on the total weight of the adhesive layer. When the adhesive layer comprises the above resin in such ranges, advantages are that in addition to being able to exert the above-described effects much more effectively, the adhesion to the copper foil is enhanced.

According to yet another preferred aspect of the present invention, the adhesive layer comprises at least one selected from the group consisting of a butadiene resin, a hydrogenated or non-hydrogenated styrene butadiene resin, an epoxy resin, and a resin having a vinyl group, in an amount of preferably 1% by weight or more, more preferably 5% by weight or more, and further preferably 10% by weight or more based on the total weight of the adhesive layer. When the adhesive layer comprises the above resin in such ranges, advantages are that it contributes to the enhancement of the adhesion to the copper foil and a decrease in the dielectric loss tangent of the adhesive layer, in addition to being able to exert the above-described effects much more effectively.

The adhesive layer may further comprise a filler as desired. The dielectric loss tangent of the resin layer can be desirably reduced by the addition of a filler. For the filler, a known one that can be used in a resin composition can be appropriately used. The filler is preferably an inorganic filler. Examples of preferred inorganic fillers include particles of silica, alumina, talc, and the like. From the viewpoint of reducing the dielectric loss tangent, silica particles are particularly preferred. The particle diameter of the filler is not particularly limited, but in terms of maintaining the surface smoothness of the resin layer and suppressing aggregation during the mixing of a varnish, the average particle diameter D50 measured by average particle diameter laser diffraction scattering particle size distribution measurement is preferably 0.01 μm or more and 2.0 μm or less, more preferably 0.01 μm or more and 1.5 μm or less, and further preferably 0.01 μm or more and 1.0 μm or less. The content of the filler in the adhesive layer is 85% by weight or less, preferably 0% by weight or more and 75% by weight or less, more preferably 0% by weight or more and 60% by weight or less, and further preferably 0% by weight or more and 50% by weight or less based on the total weight of the adhesive layer. In the case of such content, a decrease in peel strength can also be avoided while the dielectric loss tangent is excellent. When an inorganic filler is contained, filler particles subjected to specific surface treatment are preferably used. Particularly, the filler particles are preferably surface-treated with a silane coupling agent.

The adhesive layer may comprise imidazole as a curing accelerator. An imidazole-based curing accelerator is incorporated into a molecular structure as part of a resin without being liberated as ions, after a curing reaction with the resin components, and therefore the dielectric characteristics and insulation reliability of the resin layer can be made excellent. The content of the imidazole-based curing accelerator is not particularly limited, and the amount that provides the desired curing should be appropriately determined considering various conditions such as the composition of the resin layer.

The thickness of the adhesive layer is preferably 0.1 μm or more and 20 μm or less, more preferably 0.3 μm or more and 18 μm or less, further preferably 0.5 μm or more and 15 μm or less, and most preferably 1 μm or more and 10 μm or less. In the copper-clad laminate of the present invention, even if the thickness of the adhesive layer is thin like these, the ensuring of sufficient peel strength between the copper foil and the resin layer, and the improvement of the transmission characteristics exhibited by the resin layer (reduction in transmission loss) can be achieved.

The resin layer can be one generally used as a resin substrate in a copper-clad laminate and is not particularly limited. A preferred resin layer comprises a glass cloth and an insulating resin with which the glass cloth is impregnated, from the viewpoint of ensuring rigidity and insulating properties, and is typically a prepreg. Preferred examples of the insulating resin used as a prepreg include an epoxy resin, a cyanate ester resin, a polyimide resin, a bismaleimide triazine resin (BT resin), a polyphenylene ether resin, a phenolic resin, a liquid crystal polymer resin, and a polytetrafluoroethylene resin (PTFE). However, the resin layer is not limited to the above one having rigidity and may be one having flexibility. In this case, the resin layer is preferably free of glass cloth.

The dielectric loss tangent value of the resin layer at a frequency of 1 GHz, δr, is desirably low from the viewpoint of transmission loss reduction and typically 0.0001 or more and 0.03 or less, more typically 0.0001 or more and 0.02 or less, further typically 0.0002 or more and 0.01 or less, and most typically 0.0003 or more and 0.005 or less.

The thickness of the resin layer should be appropriately determined according to the application and is not particularly limited, and is preferably 5 μm or more and 5 mm or less, more preferably 10 μm or more and 3 mm or less, and further preferably 15 μm or more and 1 mm or less.

The manufacture of the copper-clad laminate should be performed according to a known method and is not particularly limited. Typically, the copper-clad laminate can be manufactured by applying a resin varnish comprising an adhesive component to a copper foil and drying the resin varnish, and bonding the obtained adhesive-attached copper foil to a resin layer (such as prepreg). Alternatively, the copper-clad laminate may be manufactured by previously applying an adhesive to a resin layer (such as prepreg) to form an adhesive-attached resin layer, bonding a copper foil to the surface of the adhesive layer, and curing the resin layer and the adhesive layer.

EXAMPLES

The present invention will be more specifically described by the following Examples.

The raw materials for resin varnishes used for the fabrication of adhesive layers in the following Examples are as follows.

<Raw Material Components for Resin Varnishes>
  polyphenylene ether resin (PPE): OPE-2St-2200 (styrene derivative of bifunctional polyphenylene ether oligomer, manufactured by MITSUBISHI GAS CHEMICAL COMPANY, INC., number average molecular weight: about 2200, viscosity at 120° C.: less than 8000 Pa·s)
  cyclic olefin resin: L3PS (cycloolefin, manufactured by ZEON Corporation, dielectric constant (1 GHz): 2.2 (nominal value), dielectric loss tangent (1 GHz): 0.0018 (nominal value))
  cyclic olefin resin: TOPAS6017 (cyclic olefin copolymer, manufactured by POLYPLASTICS CO., LTD.)
  hydrogenated styrene butadiene resin: MP-10 (hydrogenated styrene-based thermoplastic elastomer, manufactured by Asahi Kasei Corporation, dielectric constant (1 GHz): 2.4, dielectric loss tangent (1 GHz): 0.0012)
  styrene butadiene resin: TR2003 (manufactured by JSR)
  low dielectric polyimide resin: PIAD-301 (terminal functional group: carboxyl group, solvent: mixed liquid of cyclohexanone, methylcyclohexane, and ethylene glycol dimethyl ether, manufactured by Arakawa Chemical Industries, Ltd., dielectric constant (1 GHz): 2.70, dielectric loss tangent (1 GHz): 0.003, softening point: 140° C.)
  epoxy resin: NC-3000H (biphenyl aralkyl type, manufactured by Nippon Kayaku Co., Ltd., epoxy equivalent: 288 g/Eq)
  epoxidized polybutadiene resin: JP100 (manufactured by Nippon Soda Co., Ltd.)
  maleimide resin: MIR-3000 (biphenyl aralkyl type, manufactured by Nippon Kayaku Co., Ltd., functional group equivalent: 275 g/Eq)
  polycarbodiimide resin: CARBODILITE V-09 GB (manufactured by Nisshinbo Chemical Inc.)
  imidazole-based curing accelerator: 2P4MHZ (manufactured by SHIKOKU CHEMICALS CORPORATION)
  polyamide resin: BPAM-155 (phenolic hydroxyl group-containing polybutadiene-modified aromatic polyamide resin, manufactured by Nippon Kayaku Co., Ltd.)
  inorganic filler: SC-2050MTX (manufactured by Admatechs Company Limited, average particle diameter D50=0.5 μm, surface-phenylaminosilane-treated product)

Examples 1 to 3

(1) Fabrication of Electrodeposited Copper Foils

Three types of electrodeposited copper foils A to C were fabricated by the following methods.

<Electrodeposited Copper Foil A>

Electrolysis was performed in a copper sulfate solution at a solution temperature of 45° C. and a current density of 55 A/dm$^2$ using a rotating electrode made of titanium (surface roughness Ra=0.20 μm) for a cathode and DSA for an anode, thereby fabricating a raw foil. The composition of this copper sulfate solution was a copper concentration of 80 g/L, a free sulfuric acid concentration of 140 g/L, a bis(3-sulfopropyl) disulfide concentration of 30 mg/L, a diallyldimethylammonium chloride polymer concentration of 50 mg/L and a chlorine concentration of 40 mg/L. Then, the surface treatments of the following (a) to (c) were sequentially performed on the electrolytic solution surface of the raw foil.

(a) Zinc-Nickel Film Formation
 potassium pyrophosphate concentration: 80 g/L
 zinc concentration: 0.2 g/L
 nickel concentration: 2 g/L
 solution temperature: 40° C.
 current density: 0.5 A/dm$^2$
(b) Chromate Layer Formation
 chromic acid concentration: 1 g/L, pH 11
 solution temperature: 25° C.
 current density: 1 A/dm$^2$
(c) Silane Layer Formation
 silane coupling agent: 3-aminopropyltrimethoxysilane (3 g/L aqueous solution)
 liquid treatment method: shower treatment The surface-treated surface of the electrodeposited copper foil A thus obtained had a ten-point average roughness Rzjis of 0.5 μm (measured in accordance with JIS B0601-2001) and a maximum height Sz of 0.35 μm and had no particulate protrusions. The thickness of the electrodeposited copper foil A was 18 μm.

<Electrodeposited Copper Foil B>

Particulate protrusions were formed on the surface of the raw foil of the electrodeposited copper foil A on the electrolytic solution surface side, and then the same surface treatment as the electrodeposited copper foil A was performed. The formation of particulate protrusions was performed by the following three-stage electrolysis treatment. The first-stage electrolysis treatment was performed in a copper sulfate solution (copper concentration: 10.5 g/L, free sulfuric acid concentration: 220 g/L) under the conditions of a solution temperature of 30° C. and a current density of 28 A/dm$^2$. The second-stage electrolysis treatment was performed in a copper sulfate solution (copper concentration: 10.5 g/L, free sulfuric acid concentration: 220 g/L) under the conditions of a solution temperature of 30° C. and a current density of 16 A/dm$^2$. The third-stage electrolysis treatment was performed in a copper sulfate solution (copper concentration: 70 g/L, free sulfuric acid concentration: 220 g/L) under the conditions of a solution temperature of 52° C. and a current density of 21 A/dm$^2$.

The surface-treated surface of the electrodeposited copper foil B thus obtained had a ten-point average roughness Rzjis of 1.8 μm (in accordance with JIS B0601-2001) and a maximum height Sz of 3.30 μm. The thickness of the electrodeposited copper foil B was 18 μm.

<Electrodeposited Copper Foil C>

Using an electrodeposited copper foil in which the surface roughness on the electrode surface side was Rzjis=1.4 μm, roughening treatment was performed such that fine copper particles were deposited on the electrode surface side. Specifically, the above electrodeposited copper foil was immersed in a copper electrolytic solution at a liquid temperature of 25° C. having a copper concentration of 8 g/L and a free sulfuric acid concentration of 150 g/L and containing an additive (glue), and a current was passed for 10 seconds using an amount of electricity of 200 C/dm$^2$, thereby depositing and fixing fine copper particles on the surface on the electrode surface side. Then, "covering plating" was performed to anchor the fine copper particles to the electrode surface. This covering plating was performed under smooth plating conditions in which the copper concentration was 70 g/L, the free sulfuric acid concentration was 120 g/L, the liquid temperature was 45° C., and the current density was 25 A/dm$^2$.

After the roughening treatment, both surfaces of the electrodeposited copper foil were subjected to rustproofing treatment. Specifically, the electrodeposited copper foil was immersed in a solution having a potassium pyrophosphate concentration of 80 g/L, a zinc concentration of 0.2 g/L, a nickel concentration of 2 g/L, and a liquid temperature of 40° C., anode stainless steel (SUS) plates were disposed on both sides of the electrodeposited copper foil as a cathode, and electrolysis was performed at a current density of 0.5 A/dm$^2$ to form zinc-nickel alloy layers on both surfaces of the electrodeposited copper foil. Further, chromate layers were formed by an electrolysis method. Specifically, the electrodeposited copper foil was immersed in a solution having a chromic acid concentration of 1 g/L, a pH of 11, and a liquid temperature of 25° C., stainless steel (SUS) plates as anodes were disposed on both sides of the electrodeposited copper foil as a cathode, and electrolysis was performed at a current density of 1 A/dm$^2$ to form chromate layers on the surfaces of the zinc-nickel alloy layers to form rustproofing-treated layers.

The electrodeposited copper foil on which the rustproofing-treated layers were formed was rinsed with water, and the surface of the rustproofing-treated layer on the roughening-treated surface was immediately subjected to silane coupling agent treatment. This silane coupling agent treatment was performed by dissolving γ-glycidoxypropyltrimethoxysilane in ion-exchanged water to prepare an aqueous solution having a concentration of 3 g/L, showering the entire surface of the rustproofing-treated layer on the roughening-treated surface with this aqueous solution, and then bringing the surface into contact with a roll to make the liquid film thickness uniform. The electrodeposited copper foil after the silane coupling agent treatment was held for 4 seconds in a drying furnace set to an atmosphere in which the copper foil temperature was 150° C., to dissipate moisture to obtain an electrodeposited copper foil C as a surface-treated copper foil.

For the electrodeposited copper foil C thus obtained, the ten-point average roughness Rzjis of the roughening-treated surface was 3.0 μm (in accordance with JIS B0601-2001), and the maximum height Sz was 6.63 μm. The thickness of the electrodeposited copper foil C was 18 μm.

The methods for measuring the maximum height Sz and kurtosis (peakedness) Sku, which represent a surface shape, on the side (roughening-treated surface) of the electrodeposited copper foils A to C on which an adhesive layer was to be provided were as follows.

<Maximum Height Sz>

The measurement of the maximum height Sz at a copper foil surface was performed in accordance with ISO 25178 by surface texture analysis using a laser microscope (VK-X100 manufactured by KEYENCE CORPORATION). Specifically, the surface profile of a two-dimensional region in a measurement field of view of 100 μm×100 μm at a copper foil surface was measured by a laser method. The average value when measurement was performed in three places for the same sample was adopted as the value of the maximum height Sz. The results were as shown in Table 1.

<Kurtosis (Peakedness) Sku>

The measurement of the kurtosis (peakedness) Sku at a copper foil surface was performed in accordance with ISO 25178 by surface texture analysis using a laser microscope (VK-X100 manufactured by KEYENCE CORPORATION). Specifically, the surface profile of a two-dimensional region in a measurement field of view of 100 μm×100 μm at a copper foil surface was measured by a laser method. The average value when measurement was performed in 10 places for the same sample was adopted as the kurtosis (peakedness) Sku. The results were as shown in Table 1.

TABLE 1

|  |  | Ex. 1 | Ex. 2 | Ex. 3 |
|---|---|---|---|---|
| Type of electrodeposited copper foil | | A | B | C |
| Surface texture of copper foil | Sz(μm) | 0.35 | 3.30 | 6.63 |
| | Sku | 3.01 | 3.11 | 2.40 |

(2) Preparation of Resin Varnish

The above raw material components for a resin varnish and an organic solvent (mixed solvent of 50% of toluene and 50% of methyl ethyl ketone) were weighed so that a blending ratio (mass ratio) shown in Table 2 was attained and the proportion of solids was 10 parts by weight. The weighed raw material components for a resin varnish and solvent were placed into a flask and stirred by a propeller type stirring apparatus at 60° C. for 30 minutes to dissolve the resin components in the solvent, and the resin varnish was collected.

(3) Fabrication and Evaluation of Adhesive Layer Single Body

The surfaces of the copper foils A (Example 1), the copper foils B (Example 2), or the copper foils C (Example 3) having the above Sz and Sku were coated with the resin varnish obtained in the above (1) so that the coating thickness after drying was 50 μm. The coating resin varnish was dried in an oven to a semi-cured (B stage) state. Thus, two adhesive-attached copper foils 10 each comprising an adhesive layer 14 on one surface of a copper foil 12 as shown in FIG. 1 were fabricated. As shown in FIG. 1, the two adhesive-attached copper foils 10 were laminated so that the adhesive layers 14 were stacked to each other, and vacuum pressing was performed under the conditions of a pressing temperature of 190° C., a temperature holding time of 90 minutes, and a pressure of 400 N to bring the adhesive layer 14 into a cured state. The thickness of the cured adhesive layer 14 was 100 μm. The copper foils were etched away from the laminate after the pressing to obtain a resin film composed of the adhesive layer 14 alone.

<Dielectric Characteristic Evaluation-Dielectric Loss Tangent>

For the above-obtained resin film composed of the adhesive layer 14 alone, the dielectric loss tangent value at 1 GHz, δa, was measured by the SPDR dielectric resonator method using a network analyzer (PNA-L N5234A manufactured by Keysight). This measurement was performed in accordance with ASTMD2520 (JIS C2565: 1992). The results were as shown in Table 2. In Table 2, the magnitude relationship with the dielectric loss tangent value of the prepreg used as the resin layer in (4) and (5) described later at 1 GHz, δr, is also shown together. As seen from Table 2, it is seen that the dielectric loss tangent value of the adhesive layer at a frequency of 1 GHz, δa, is equal to or less than the dielectric loss tangent value of the resin layer (prepreg) at a frequency of 1 GHz, δr (=0.003).

(4) Fabrication of Copper-Clad Laminate and Measurement of Peel Strength R

According to the same procedure as the above (3), as shown in FIG. 2, adhesive layers 24 were formed on the surfaces of copper foils 22, that is, the copper foils A (Example 1), the copper foils B (Example 2), or the copper foils C (Example 3), having the above Sz and Sku so that the coating thickness after drying was 4 μm, thereby fabricating adhesive-attached copper foils 20. Then, the adhesive-attached copper foils 20 as outermost layers were laminated together with two prepregs (MEGTRON-6 manufactured by Panasonic Corporation, actual thickness: 200 μm, dielectric constant Dk: 3.9 and dielectric loss tangent Df: 0.003 at 1 GHz by SPDR method), which were resin layers 26, to obtain a resin substrate having a thickness of 0.25 mm. As shown in FIG. 2, vacuum pressing was performed under the conditions of a pressing temperature of 190° C., a temperature holding time of 120 minutes, and a pressure of 300 N to bring the adhesive layers 24 into a cured state to obtain a copper-clad laminate 28. Peel strength measurement test circuits were formed on the obtained copper-clad laminate 28. Specifically, dry films were bonded to both surfaces of the copper-clad laminate 28 to form etching resist layers. Then, the etching resist layers on both surfaces were exposed and developed for peel strength measurement test circuits having a width of 10 mm to form etching patterns. Then, circuit etching was performed with a copper etchant, and the etching resists were stripped to obtain circuits 22a. The circuit 22a thus formed was peeled off from the adhesive layer 24 to measure the peel strength R (kN/m) between the circuit 22a and the adhesive layer 24. The measurement of this peel strength R was performed in accordance with JIS C 6481-1996. The results were as shown in Table 2.

(5) Fabrication of Copper-Clad Laminate and Measurement of Transmission Loss

According to the same procedure as the above (3), as shown in FIG. 2, adhesive layers 24 were formed on the surfaces of copper foils 22, that is, the copper foils A (Example 1), the copper foils B (Example 2), or the copper foils C (Example 3), having the above Sz and Sku so that the coating thickness after drying was 4 μm, thereby fabricating adhesive-attached copper foils 20. Then, the adhesive-attached copper foils 20 as outermost layers were laminated together with two prepregs (MEGTRON-6 manufactured by Panasonic Corporation, actual thickness: 68 μm, dielectric constant Dk: 3.9 and dielectric loss tangent Df: 0.003 at 1 GHz by SPDR method), which were resin layers 26, to obtain a both-surface copper-clad laminate 28 having a thickness of 0.14 mm. Then, the copper foil was pattern-etched to make a microstrip circuit. A pattern in which the characteristic impedance of the circuit was 50Ω was selected, and the transmission loss S21 (db/cm) at 50 GHz was measured. The results were as shown in Table 2. Table 2 also shows together the relative proportions (%) to the transmission loss S21 (db/cm), at 50 GHz, of reference samples fabricated in the same manner as above except that the copper foils A, B, or C were directly laminated on prepregs without using adhesive layers (see Examples 11 to 13 described later). It is meant that the lower this relative proportion is, the larger the effect of reducing the transmission loss due to the adhesive layers is.

Example 4

The above raw material components for a resin varnish and an organic solvent (cyclopentanone) were weighed so that a blending ratio (mass ratio) shown in Table 2 was attained and the proportion of solids was 30 parts by weight. The weighed raw material components for a resin varnish and solvent were placed into a flask and stirred by a propeller type stirring apparatus at ordinary temperature for 30 minutes to dissolve the resin components in the solvent, and the resin varnish was collected. The fabrication and evaluation of an adhesive layer and a copper-clad laminate were performed in the same manner as in Example 1 except that the resin varnish thus obtained was used. The results were as shown in Table 2.

Examples 5 to 7

The above raw material components for a resin varnish and an organic solvent (toluene) were weighed so that a blending ratio (mass ratio) shown in Table 2 was attained and the proportion of solids was 10 parts by weight. The weighed raw material components for a resin varnish and solvent were placed into a flask and stirred by a propeller type stirring apparatus at 60° C. for 30 minutes to dissolve the resin components in the solvent, and the resin varnish was collected. The fabrication and evaluation of an adhesive layer and a copper-clad laminate were performed in the same manner as in Example 1 except that the resin varnish thus obtained was used. The results were as shown in Table 2.

Example 8 (Comparison)

The above raw material components for a resin varnish and an organic solvent (mixed solvent of 50% of toluene and 50% of methyl ethyl ketone) were weighed so that a blending ratio (mass ratio) shown in Table 3 was attained and the proportion of solids was 10 parts by weight. The weighed raw material components for a resin varnish and solvent were placed into a flask and stirred by a propeller type stirring apparatus at 60° C. for 30 minutes to dissolve the resin components in the solvent, and the resin varnish was collected. The fabrication and evaluation of an adhesive layer and a copper-clad laminate were performed in the same manner as in Example 1 except that the resin varnish thus obtained was used. The results were as shown in Table 3.

Examples 9 and 10 (Comparison)

The above raw material components for a resin varnish and an organic solvent (mixed solution of 25% of dimethylacetamide and 75% of cyclopentanone) were weighed so that a blending ratio (mass ratio) shown in Table 3 was attained and the proportion of solids was 10 parts by weight. The weighed raw material components for a resin varnish and solvent were placed into a flask and stirred by a propeller type stirring apparatus at 60° C. for 30 minutes to dissolve the resin components in the solvent, and the resin varnish was collected. The fabrication and evaluation of an adhesive layer and a copper-clad laminate were performed in the same manner as in Example 1 except that the resin varnish thus obtained was used. The results were as shown in Table 3.

Example 11 (Comparison)

The fabrication of a copper foil laminate and the measurement of transmission loss were performed in the same manner as in Example 1 except that adhesive layers were not formed. The results were as shown in Table 3.

Example 12 (Comparison)

The fabrication of a copper foil laminate and the measurement of transmission loss were performed in the same manner as in Example 2 except that adhesive layers were not formed. The results were as shown in Table 3.

Example 13 (Comparison)

The fabrication of a copper foil laminate and the measurement of transmission loss were performed in the same manner as in Example 3 except that adhesive layers were not formed. The results were as shown in Table 3.

TABLE 2

| | | Product name | Ex. 1 | Ex. 2 | Ex. 3 | Ex. 4 | Ex. 5 | Ex. 6 | Ex. 7 |
|---|---|---|---|---|---|---|---|---|---|
| Adhesive layer (parts by weight) | Polyphenylene ether resin (PPE) | OPE-2St-2200 | | 50 | | | | | |
| | Cyclic olefin resin | L3PS | | | | | 100 | | |
| | Cyclic olefin resin | TOPAS6017 | | | | | | 100 | |
| | Hydrogenated styrene butadiene resin | MP-10 | | | | 10 | | | 100 |
| | Styrene butadiene resin | TR2003 | | | 20 | | | | |
| | Low dielectric polyimide resin | PIAD-301 | | | | 30.5 | | | |
| | Epoxy resin | NC-3000H | | | | 3 | | | |
| | Epoxidized polybutadiene resin | JP100 | | | | | | | |
| | Maleimide resin | MIR-3000 | | | | 8 | | | |
| | Polycarbodiimide resin | V-09GB | | | | 3 | | | |
| | Imidazole | 2P4MHZ | | | | 0.5 | | | |
| | Polyamide resin | BPAM-155 | | | | | | | |
| | Inorganic filler | SC-2050MTX | | | 30 | 45 | | | |
| Total | | | | 100 | 100 | 100 | 100 | 100 | |

TABLE 2-continued

| | Product name | Ex. 1 | Ex. 2 | Ex. 3 | Ex. 4 | Ex. 5 | Ex. 6 | Ex. 7 |
|---|---|---|---|---|---|---|---|---|
| Type of electrodeposited copper foil | | A | B | C | A | A | A | A |
| Evaluation with adhesive layer single body (@1 GHz) | Dielectric loss tangent value δa | 0.0019 | | | 0.003 | 0.0018 | 0.0001 | 0.0012 |
| | Relationship with dielectric loss tangent value of resin layer, δr | | | | δa ≤ δr (=0.003) | | | |
| Evaluation of adhesive layer as primer layer | Peel strength (kN/m) | 0.53 | 0.65 | 0.81 | 0.72 | 0.51 | 0.95 | 0.63 |
| Evaluation of microstrip circuit (@50 GHz) | Transmission loss (db/cm) | −0.46 | −0.55 | −0.68 | −0.50 | −0.46 | −0.47 | −0.46 |
| | Relative proportion (%) of transmission loss to reference value* | 89 | 33 | 96 | 96 | 89 | 90 | 89 |

*The reference value of transmission loss is the value shown in Example 11 for one using copper foils A, the value shown in Example 12 for one using copper foils B, and the value shown in Example 13 for one using copper foils C.

TABLE 3

| | | Product name | Ex. 8* | Ex. 9* | Ex. 10* | Ex. 11* | Ex. 12* | Ex. 13* |
|---|---|---|---|---|---|---|---|---|
| Adhesive layer (parts by weight) | Polyphenylene ether resin (PPE) | OPE-2St-2200 | 44.5 | | | No adhesive layer | | |
| | Cyclic olefin resin | L3PS | | | | | | |
| | Cyclic olefin resin | TOPAS6017 | | | | | | |
| | Hydrogenated styrene butadiene resin | MP-10 | | | | | | |
| | Styrene butadiene resin | TR2003 | 10 | | | | | |
| | Low dielectric polyimide resin | PIAD-301 | | 39.5 | 42.5 | | | |
| | Epoxy resin | NC-3000H | 5 | 10 | 17 | | | |
| | Epoxidized polybutadiene resin | JP100 | 10 | | | | | |
| | Maleimide resin | MIR-3000 | | | | | | |
| | Polycarbodiimide resin | V-09GB | | | | | | |
| | Imidazole | 2P4MHZ | 0.5 | 0.5 | 0.5 | | | |
| | Polyamide resin | BPAM-155 | | 20 | 10 | | | |
| | Inorganic filler | SC-2050MTX | 30 | 30 | 30 | | | |
| | Total | | 100 | 100 | 100 | 0 | 0 | 0 |
| Type of electrodeposited copper foil | | | A | A | A | A | B | C |
| Evaluation with adhesive layer single body (@1 GHz) | Dielectric loss tangent value δa | | 0.0100 | 0.009 | 0.008 | No adhesive layer | | |
| | Relationship with dielectric loss tangent value of resin layer, δr | | δa > δr (=0.003) | | | | | |
| Evaluation of adhesive layer as primer layer | Peel strength (kN/m) | | 0.5 | 0.74 | 0.75 | — | — | — |
| Evaluation of microstrip circuit (@50 GHz) | Transmission loss (db/cm) | | −0.59 | −0.56 | −0.55 | −0.52 | −0.59 | −0.71 |
| | Relative proportion (%) of transmission loss to reference value* | | 114 | 108 | 106 | 100 | 100 | 100 |

*indicates a comparative example.
*The reference value of transmission loss is the value shown in Example 11 for one using copper foils A, the value shown in Example 12 for one using copper foils B, and the value shown in Example 13 for one using copper foils C.

The invention claimed is:

1. A copper-clad laminate comprising:
   a copper foil;
   an adhesive layer provided on a surface of the copper foil and comprising one or more selected from the group consisting of an olefin resin, a liquid crystal polymer, a polyester resin, a benzoxazine resin, an active ester resin, a cyanate ester resin, and a fluororesin; and
   a resin layer provided on a surface of the adhesive layer,
   wherein the olefin resin is at least one selected from the group consisting of a polyethylene resin, a polypropylene resin, a polymethylpentene resin, and a cycloolefin resin,
   wherein the surface of the copper foil on the adhesive layer side has a maximum height Sz of 6.8 μm or less as measured in accordance with ISO 25178, and the adhesive layer has a dielectric loss tangent value at a frequency of 1 GHz, δa, which is equal to or less than a dielectric loss tangent value of the resin layer at a frequency of 1 GHz, δr,
   wherein the surface of the copper foil on the adhesive layer side has a kurtosis Sku of 2.0 or more and 3.5 or less as measured in accordance with ISO 25178 at the surface of the copper foil on the adhesive layer side, and
   wherein the adhesive layer has a thickness of 0.1 μm or more and 20 μm or less.

2. The copper-clad laminate according to claim 1, wherein the maximum height Sz at the surface of the copper foil on the adhesive layer side is 0.15 μm or more and 6.8 μm or less.

3. The copper-clad laminate according to claim 1, wherein the dielectric loss tangent value of the adhesive layer at a frequency of 1 GHz, δa, is 0.0001 or more and 0.003 or less.

4. The copper-clad laminate according to claim 1, wherein the dielectric loss tangent value of the resin layer at a frequency of 1 GHz, δr, is 0.0001 or more and 0.03 or less.

5. The copper-clad laminate according to claim 1, wherein the adhesive layer comprises at least one selected from the group consisting of an olefin resin, a liquid crystal polymer, and a fluororesin in an amount of 10% by weight or more based on a total weight of the adhesive layer,
wherein the olefin resin is at least one selected from the group consisting of a polyethylene resin, a polypropylene resin, a polymethylpentene resin, and a cycloolefin resin.

6. The copper-clad laminate according to claim 1, wherein the resin layer comprises a glass cloth and an insulating resin with which the glass cloth is impregnated.

7. The copper-clad laminate according to claim 1, wherein the resin layer has a thickness of 5 μm or more and 5 mm or less.

8. The copper-clad laminate according to claim 1, having a peel strength of the copper foil from the adhesive layer of 0.3 kN/m or more as measured in accordance with JIS C 6481-1996.

9. A method for manufacturing the copper-clad laminate according to claim 1, comprising:

providing a copper foil having a surface having a maximum height Sz of 6.8 μm or less as measured in accordance with ISO 25178;

applying a resin varnish comprising an adhesive to a surface of the copper foil and drying the resin varnish to obtain an adhesive-attached copper foil, the adhesive comprising one or more selected from the group consisting of an olefin resin, a liquid crystal polymer, a polyester resin, a benzoxazine resin, an active ester resin, a cyanate ester resin, and a fluororesin, and, having a dielectric loss tangent value at a frequency of 1 GHz of δa after curing; and bonding the adhesive-attached copper foil to a resin layer having a dielectric loss tangent value at a frequency of 1 GHz of δr to form a copper-clad laminate, wherein the δa is equal to or less than the δr, wherein the olefin resin is at least one selected from the group consisting of a polyethylene resin, a polypropylene resin, a polymethylpentene resin, and a cycloolefin resin, and wherein the adhesive layer has a thickness of 0.1 μm or more and 20 μm or less.

\* \* \* \* \*